United States Patent
Chien et al.

(10) Patent No.: US 10,015,892 B1
(45) Date of Patent: Jul. 3, 2018

(54) DISK DRIVE HOLDING MECHANISM AND SERVER USING THE SAME

(71) Applicant: Super Micro Computer Inc., San Jose, CA (US)

(72) Inventors: Shih-hsing Chien, San Jose, CA (US); Ken-Sheng Lin, San Jose, CA (US); Richard S. Chen, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 0 days.

(21) Appl. No.: 15/682,302

(22) Filed: Aug. 21, 2017

(30) Foreign Application Priority Data

Jun. 14, 2017 (TW) .............................. 106208604 U (51) Int. Cl.
*G06F 1/18* (2006.01)
*H05K 5/00* (2006.01)
*H05K 5/02* (2006.01)

(52) U.S. Cl.
CPC .......... *H05K 5/0021* (2013.01); *G06F 1/187* (2013.01); *H05K 5/0013* (2013.01); *H05K 5/0221* (2013.01); *H05K 5/0247* (2013.01)

(58) Field of Classification Search
CPC ..................................................... G06F 1/187
USPC ................................................... 361/679.33
See application file for complete search history.

(56) References Cited

U.S. PATENT DOCUMENTS

| | | | | |
|---|---|---|---|---|
| 7,198,338 B2* | 4/2007 | Liu | ......................... | A47B 67/04 312/223.1 |
| 7,495,908 B2* | 2/2009 | Zhang | .................. | G11B 33/123 361/679.33 |
| 2004/0264121 A1* | 12/2004 | Orriss | ..................... | G06F 1/184 361/679.33 |
| 2005/0078445 A1* | 4/2005 | Chen | ....................... | G06F 1/184 361/679.31 |
| 2005/0116135 A1* | 6/2005 | Peng | .................... | G11B 33/124 248/694 |
| 2006/0232925 A1* | 10/2006 | Han | ......................... | G06F 1/183 361/679.37 |
| 2007/0235625 A1* | 10/2007 | Liang | ..................... | G06F 1/187 248/675 |
| 2007/0279889 A1* | 12/2007 | Zhang | ..................... | G06F 1/187 361/810 |

* cited by examiner

*Primary Examiner* — Adrian S Wilson
(74) *Attorney, Agent, or Firm* — Chun-Ming Shih; HDLS IPR Services (57) ABSTRACT

A storage device holding mechanism is provided, including a holding frame and a detaching mechanism. The holding frame holds a storage device; the holding frame includes a bottom plate and includes a first side plate and a second side plate connected to the bottom plate. The detaching mechanism is assembled to one side of the first side plate and includes a push rod and a latch structure for fastening the push rod. The push rod is slidable to be fastened to the latch structure in a fastened position or to be separated from the latch structure in a detached position. When the push rod is in the fastened position, one end of the push rod is flush with one side of the holding frame. When the push rod is released from the latch structure, the push rod slides to the detached position.

16 Claims, 11 Drawing Sheets

DISK DRIVE HOLDING MECHANISM AND SERVER USING THE SAME

TECHNICAL FIELD

The present invention relates to a storage device (e.g., disk drive) holding mechanism and, in particular, to a small-size storage device holding mechanism and a server using the same.

BACKGROUND

In general, a disk drive is fixed in a disk drive holding module, and then the disk drive holding module is placed in an insertion space of a chassis. After the disk drive in the holding module is electrically connected to a back plate, installation of the disk drive is completed. However, there are various server chassis with different specifications, and there are also a variety of detaching structures available for detaching the disk drive holding module from the chassis. In particular, the conventional detaching structures often have a large size (i.e. they often protrude from the disk drive holding module), so they need a larger space for operation. As a result, it is difficult to reduce the size of the server chassis and to receive more disk drives in a limited space.

SUMMARY

It is an object of the present invention to provide a small-size storage device (e.g., disk drive) holding mechanism and a server using the same.

It is another object of the present invention to provide a storage device holding mechanism and a server using the storage device holding mechanism, wherein the storage device holding mechanism is suitable for a limited small space, and more storage devices can be received.

Accordingly, the present invention provides a storage device holding mechanism which comprises a holding frame and a detaching mechanism. The holding frame holds a storage device. The holding frame includes a bottom plate and includes a first side plate and a second side plate connected to the bottom plate at two opposite sides thereof. The detaching mechanism is assembled to one side of the first side plate. The detaching mechanism includes a push rod and a latch structure for fastening the push rod. The push rod is fastened to the latch structure in a fastened position and configured to, when the latch structure releases the push rod, slide from the fastened position to a detached position where the push rod is detached from the latch structure, one end of the push rod is flush with one side of the holding frame; and when the latch structure releases the push rod, the push rod slides to the detached position.

The present invention further has the following functions. The detaching mechanism of the present invention is disposed on one side of one of the side plates. The push rod of the detaching mechanism is linearly operated (when pressed or when unfastened), so no additional space is required for linear-motion operation. When the push rod is in the fastened position, the push rod is flush with the holding frame (i.e. the push rod is received and hidden in the holding frame). Due to this configuration, a length of the storage device holding mechanism is effectively shortened. When the push rod is in the detached position, the push rod protrudes out of the holding frame, so that a user can pull the push rod to take or replace the storage device with ease.

Accordingly, the present invention provides a server which comprises a chassis and a plurality of storage device holding mechanisms. The chassis includes a tray, a back plate perpendicularly disposed on the tray, a plurality of pairs of supporters spaced apart from each other and arranged perpendicular to the back plate, and a plurality of accommodating spaces formed between the respective pairs of supporters. Each of the storage device holding mechanisms is assembled in each of the accommodating spaces between a respective corresponding pair of the supporters.

When each storage device holding mechanism is in the fastened position, the push rod is hidden in the accommodating space between a respective corresponding pair of the supporters. In other words, the push rod is flush with the corresponding pair of the supporters. This way, the chassis occupies a small room to facilitate miniaturization.

BRIEF DESCRIPTION OF THE DRAWINGS

The disclosure will become more fully understood from the detailed description, and the drawings given herein below is for illustration only, and thus does not limit the disclosure, wherein.

DETAILED DESCRIPTION

Detailed descriptions and technical contents of the present invention are illustrated below in conjunction with the accompany drawings. However, it is to be understood that the descriptions and the accompany drawings disclosed herein are merely illustrative and exemplary and not intended to limit the scope of the present invention.

As shown in FIGS. 1 to 5, the present invention provides a storage device holding mechanism 100 which includes a holding frame 110 and a detaching mechanism 150. The holding frame 110 holds the storage device 10. The holding frame 110 preferably consists of metal or alloy. The holding frame 110 includes a bottom plate 112 and also includes a first side plate 114 and a second side plate 116 connected to the bottom plate 112 at two opposite sides thereof. In the embodiment shown in FIGS. 2 and 3, a plurality of positioning pillars 134, 148 protrude from one or both of the first side plate 114 and the second side plate 116 toward the bottom plate 112, so as to fasten each positioning hole 20 of the storage device 10.

The storage device 10 includes, but not limited to, a hard disk drive (HDD), a solid-state drive (SSD), or a solid-state hybrid drive (SSHD). The storage device 10 can be a 2.5-inch solid-state drive (SSD), an SSD having other suitable size, a 2.5-inch disk drive, a 3.5-inch disk drive, a disk drive employing a disk having other suitable size, or any other type of storage device employing other types of storage media.

The detaching mechanism 150 is assembled to one side of the first side plate 114, and the detaching mechanism 150 includes a push rod 160 and a latch structure 170 for fastening the push rod 160. The push rod 160 is fastened to the latch structure 170 in a fastened position L and configured to, when the latch structure 170 releases the push rod 160, slide from the fastened position L to a detached position R where the push rod 160 is detached from the latch structure 170. When the push rod 160 is in the fastened position L, one end (i.e. a press portion 162) of the push rod 160 is flush with one side of the holding frame 110. When the latch structure 170 is rotated to release the push rod 160, the push rod 160 resiliently slides to the detached position R.

A press portion 162 and a hook portion 164 are disposed at two ends of the push rod 160 respectively. The latch structure 170 includes a base 172 fixed to a lower portion of the first side plate 114 and includes a movable element 180 movable with respect to the base 172. When the press portion 162 is in the fastened position L, the press portion 162 is flush with one side of the holding frame 110, and the hook portion 164 is fastened by a fastener 181 of the movable element 180, so that a socket connector 30 of the storage device 10 is electrically connected to a corresponding plug connector (not illustrated). In this way, the entire storage device holding mechanism 100 has a small size which can fit in a limited space of a small server.

Referring to FIGS. 6 to 9, the storage device holding mechanism 100 further includes a first resilient element 174 received between the base 172 and the movable element 180 and includes a linkage 176 limiting movement of the movable element 180. The movable element 180 includes a root portion 182 for guiding movement of the linkage 176, a swing head 184 having the fastener 181, and a connection section 186 connected to the root portion 182 and the swing head 184. The connection section 186 is correspondingly disposed at one side of the first resilient element 174, so that the swing head 184 is rotatable with respect to the root portion 182.

A blocker 188 and a track 190 are disposed on at least one side of the root portion 182, and the blocker 188 limits movement of the linkage 176 or releases the linkage 176 to move along the track 190. The linkage 176 is preferably of a U shape or the like. One end of the linkage 176 is fixed to the base 172, and the other end of the linkage 176 is limited in movement or is released to move along the track 190 by means of the blocker 188. The linkage 176 is preferably made of metal or alloy, and the detaching mechanism 150 is preferably made of plastic or fiber reinforced plastic; however, the present invention is not limited in this regard.

Figure 6:
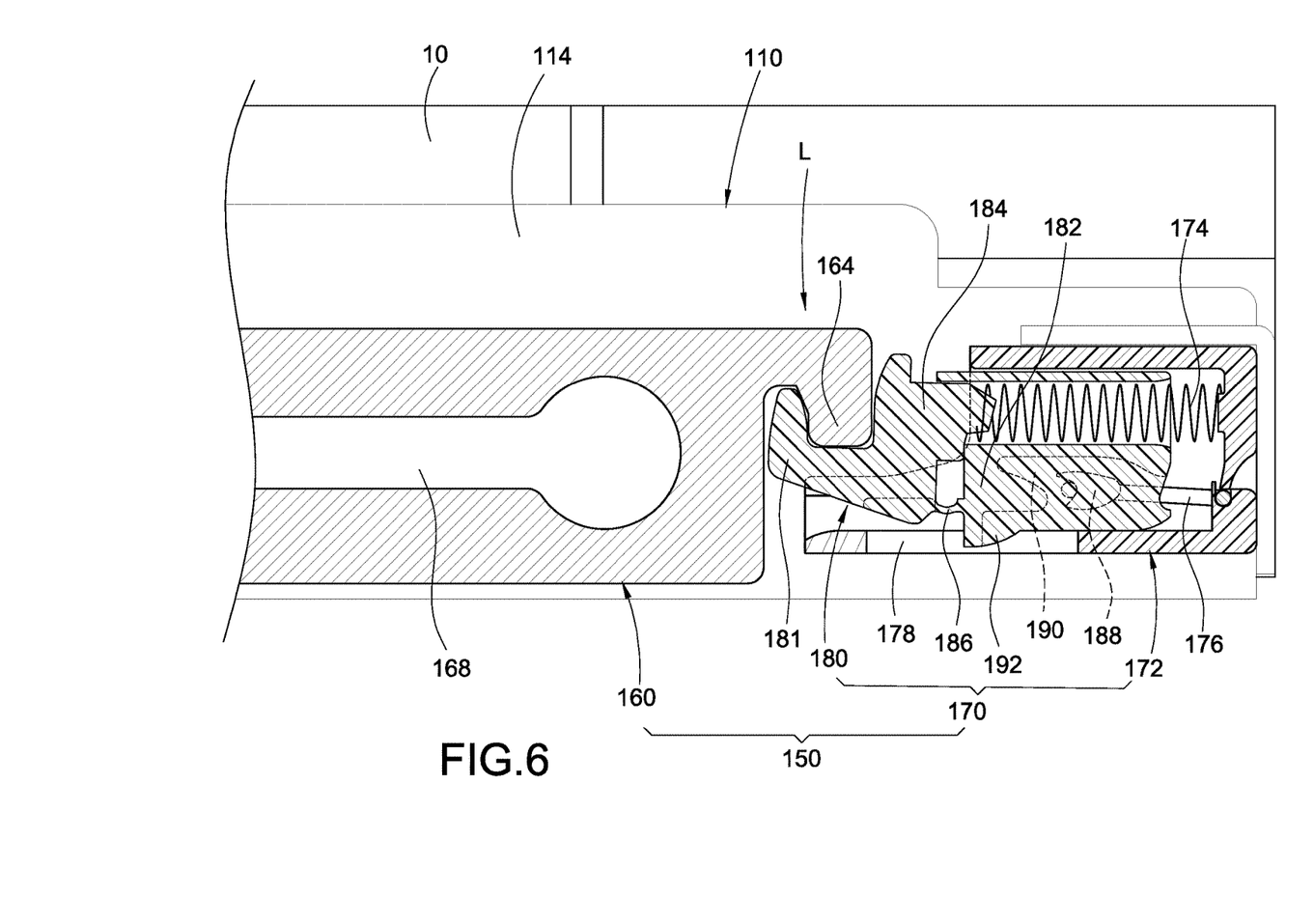
FIG. 6 is a partial cross-sectional view illustrating that a latch structure fastens the push rod.
Figure 7:
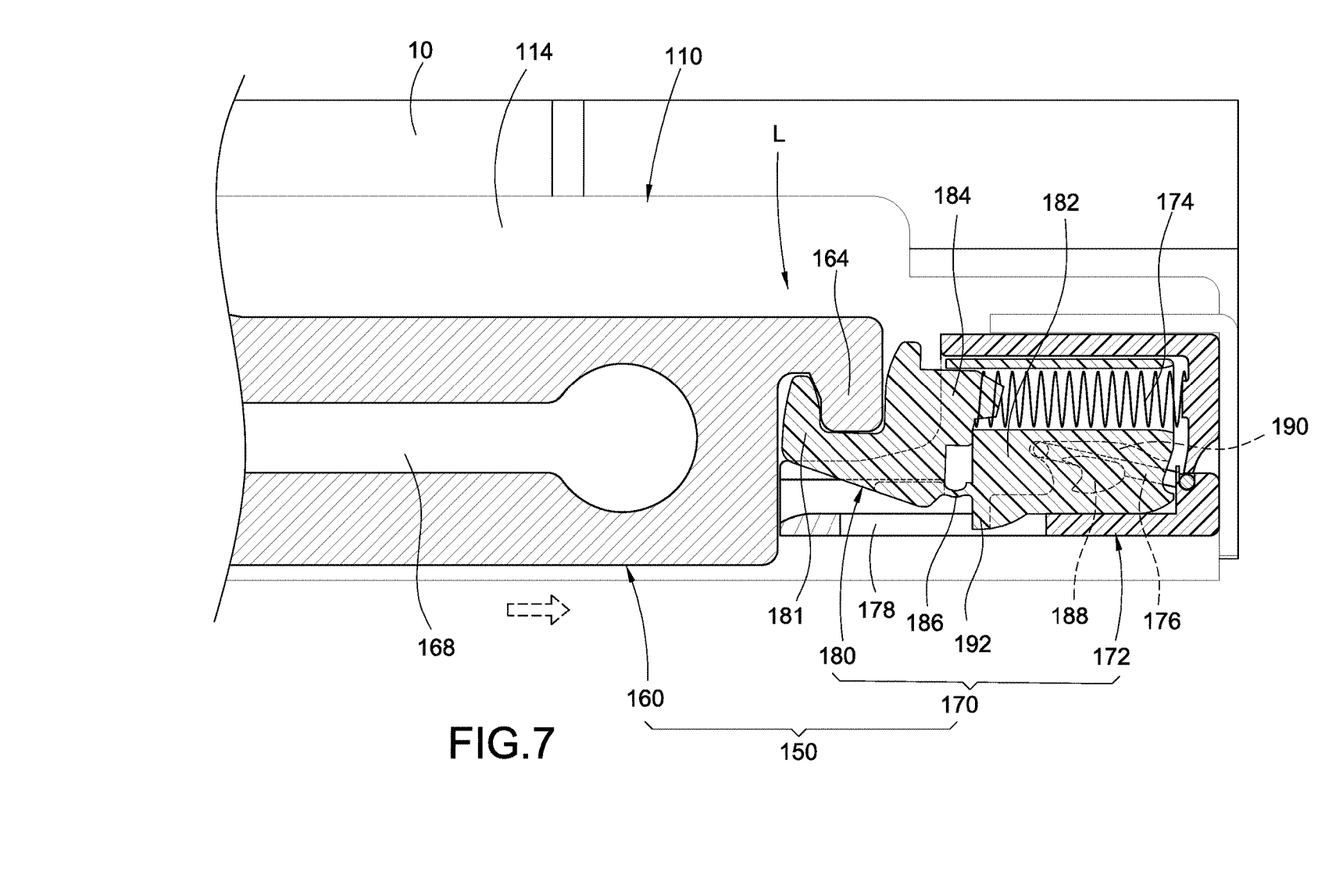
FIG. 7 is a cross-sectional view illustrating that the push rod pushes a movable element of the latch structure.

Two ends of the first resilient element 174 are in contact with one end of the swing head 184 and an inner surface of the base 172. When the hook portion 164 pushes the movable element 180, the linkage 176 releases the movable element 180, the first resilient element 174 resiliently pushes the movable element 180 to remove it from the base 172, and the fastener 181 of the movable element 180 is thereby rotated to release the hook portion 164. Furthermore, when the push rod 160 is in the fastened position L, the first resilient element 174 is compressed by the movable element 180 to be in a compressed state, as shown in FIGS. 6 and 7. At this point, the linkage 176 is engaged with the blocker 188 of the root portion 182 to limit its movement, so that the movable element 180 is not pushed out of the base 172 by the first resilient element 174.

Figure 8:
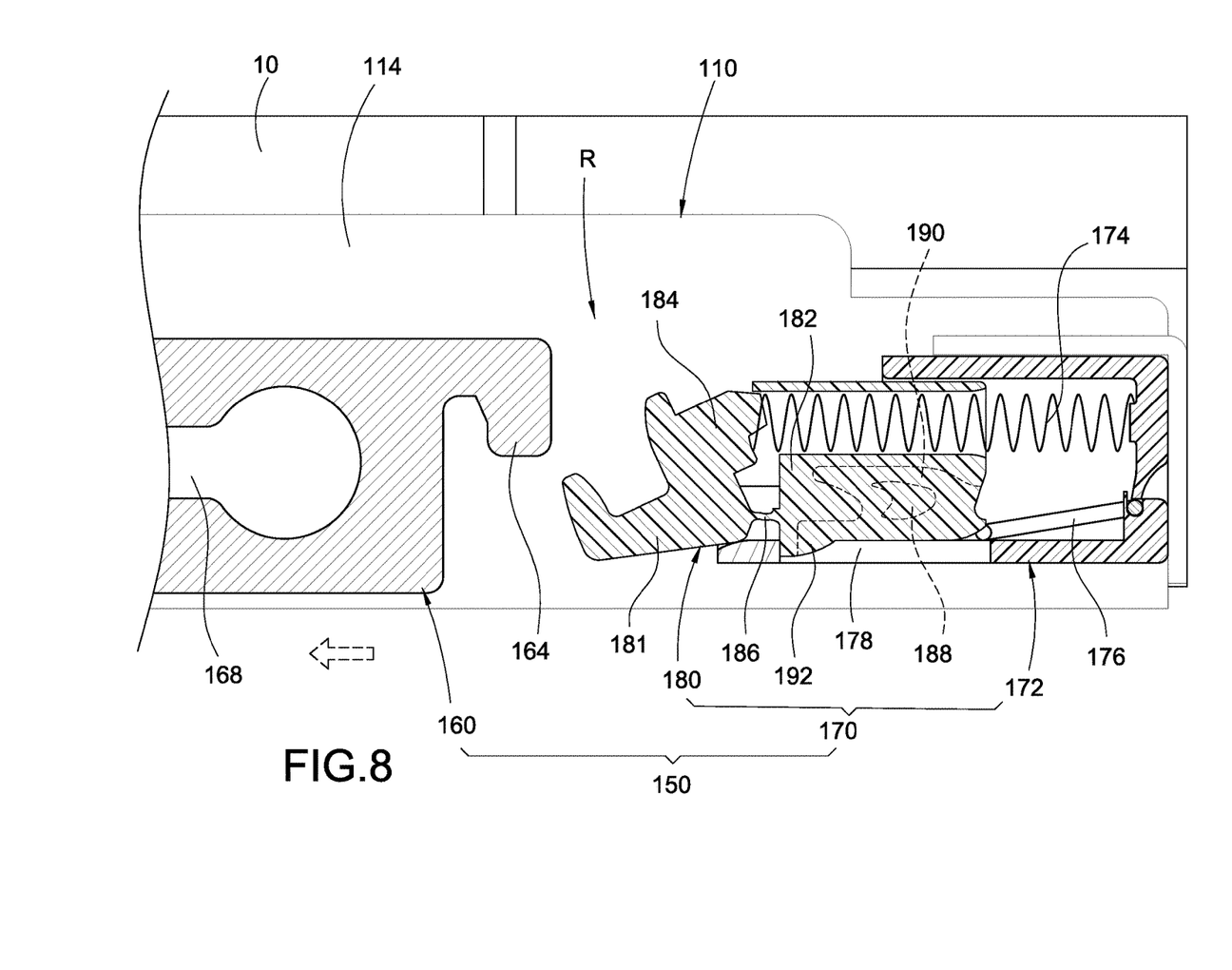
FIG. 8 is a cross-sectional view illustrating that the movable element rotates to release a hook portion of the push rod.
Figure 9:
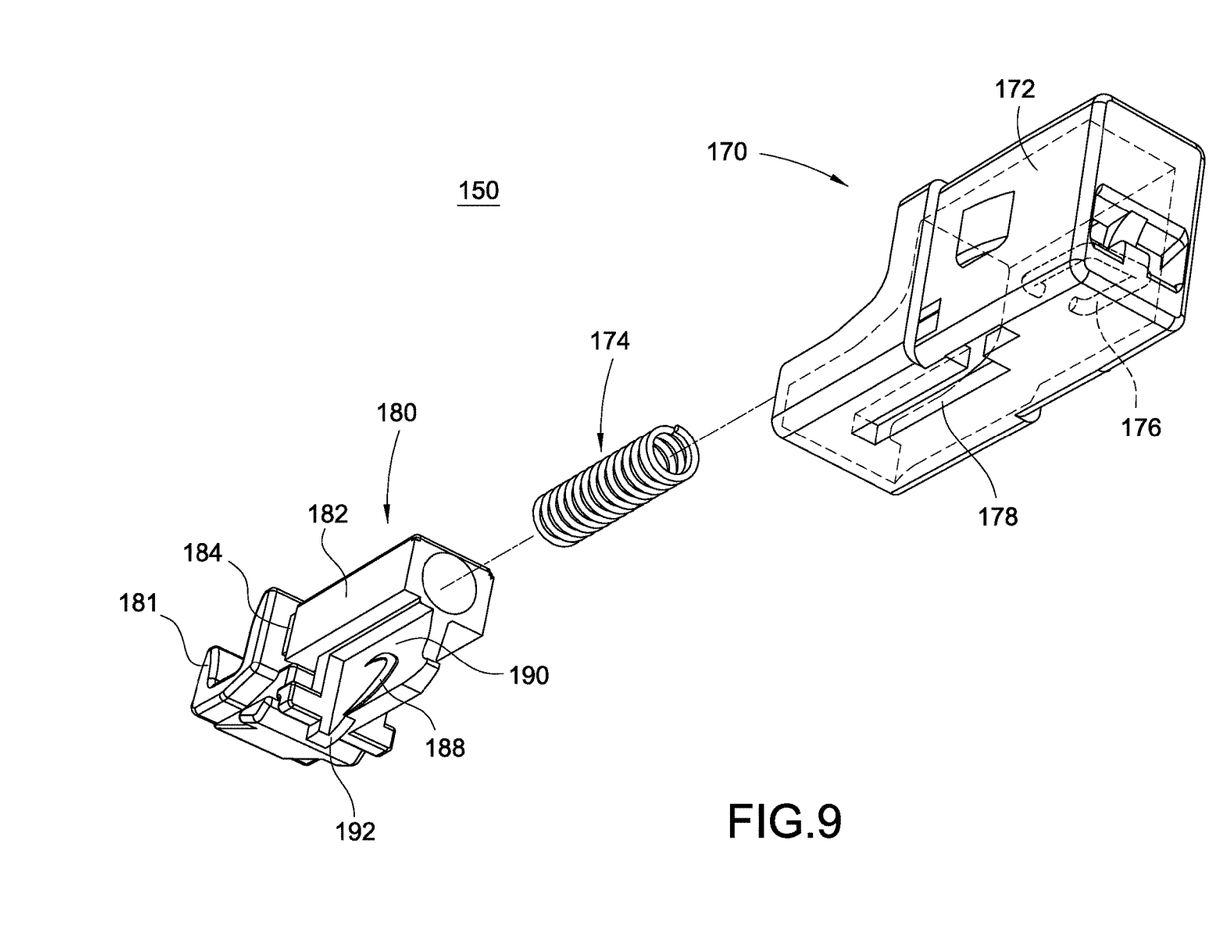
FIG. 9 is an exploded view illustrating the latch structure.

When the press portion 162 is pressed once by a user, the linkage 176 is moved to be released from the blocker 188 and moves along the track 190, as shown in FIG. 8. At this point, the first resilient element 174 resiliently pushes the swing head 184 of the movable element 180, so that the swing head 184 is rotated toward the hook portion 164 away from the root portion 182. Then, the push rod 160 is automatically detached and resiliently pulled to the detached position R. The structure and movement of the push rod 160 will be further described in details later in this specification.

The root portion 182 includes, at its bottom, a guide block 192, the base 172 includes a limitation groove 178 corresponding to the guide block 192, and the guide block 192 is limited to move along the limitation groove 178, and thereby the movable element 180 moves with stability and is effectively limited. When the push rod 160 moves from the detached position R to the fastened position L, the user only needs to press once more to fasten the push rod 160. In other words, the detaching mechanism 150 employs a push-push type mechanism to fasten or unfasten. This design/structure is simple, and operation is easy and simply requires one click.

Figure 3:
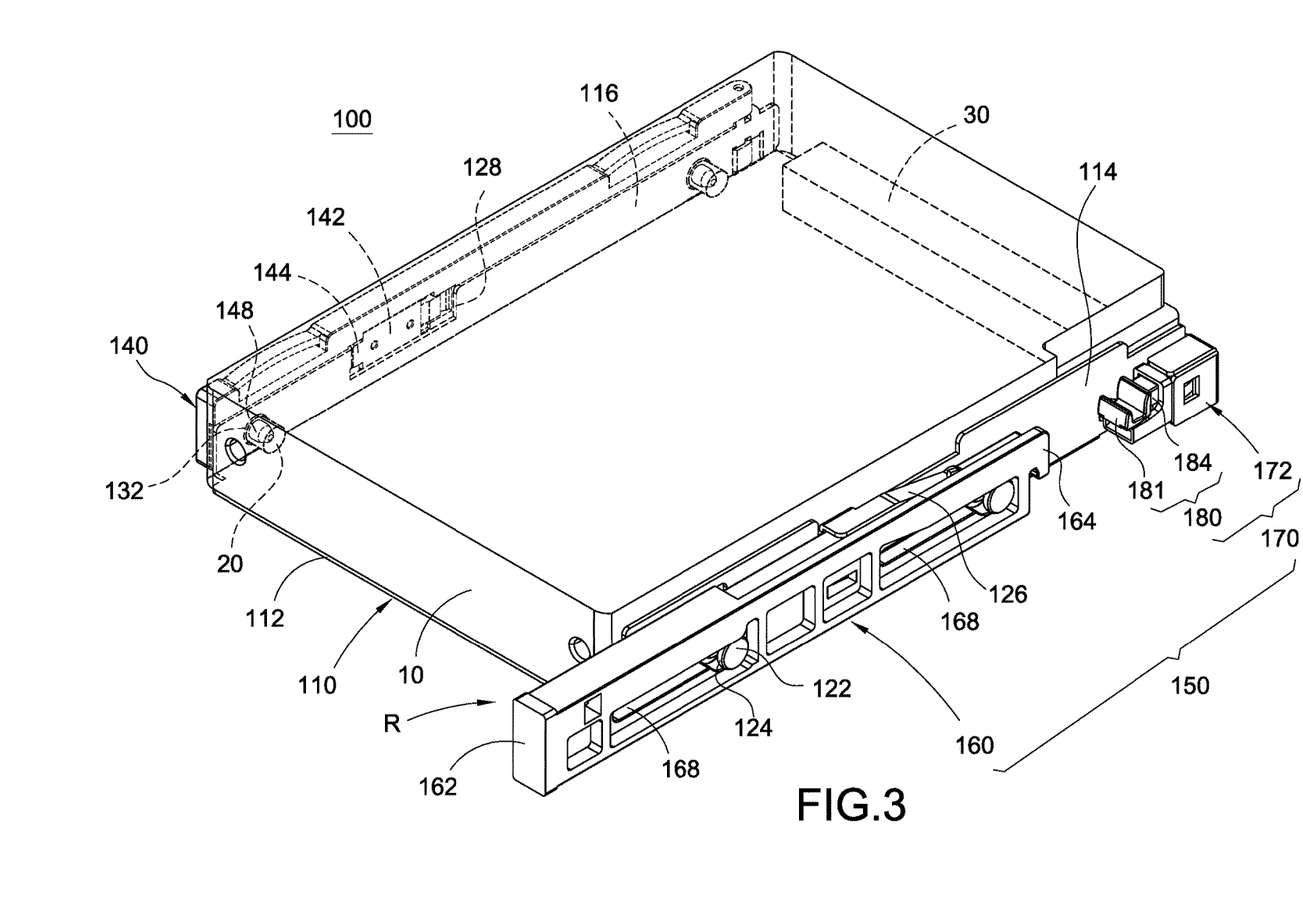
FIG. 3 is a perspective view illustrating that a storage device is installed in the storage device holding mechanism.
Figure 4:
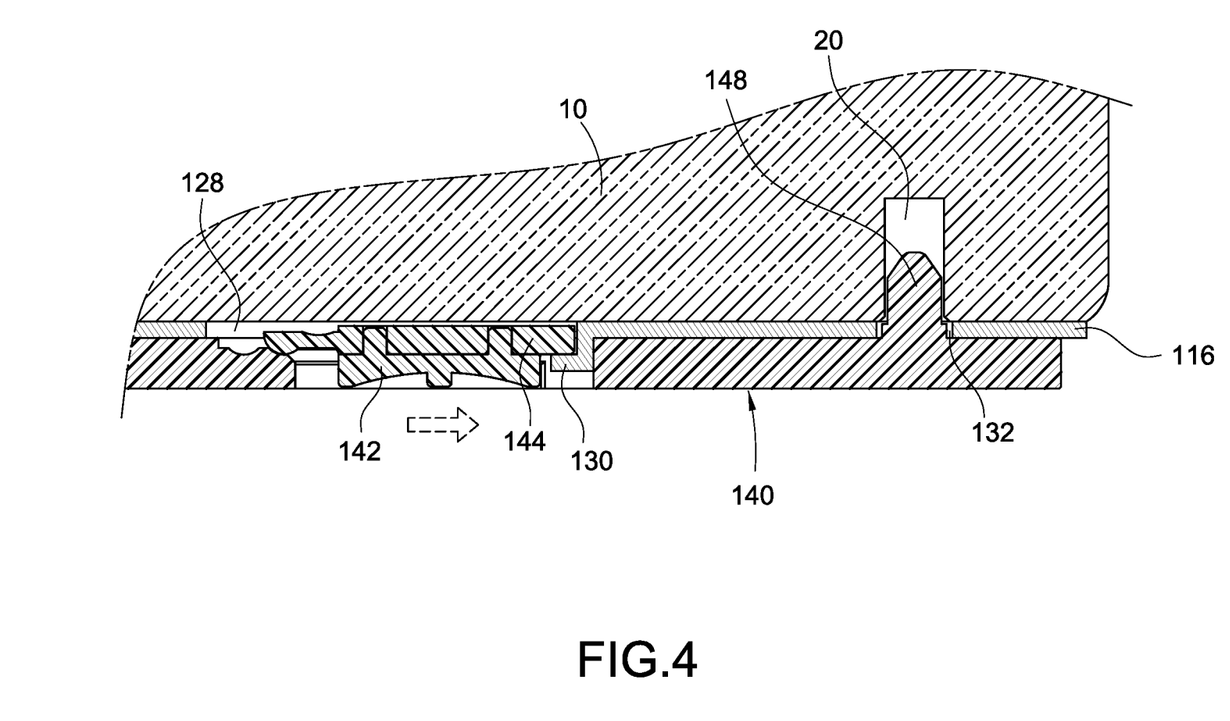
FIG. 4 is a partial cross-sectional view illustrating a release arm positioning the storage device.
Figure 5:
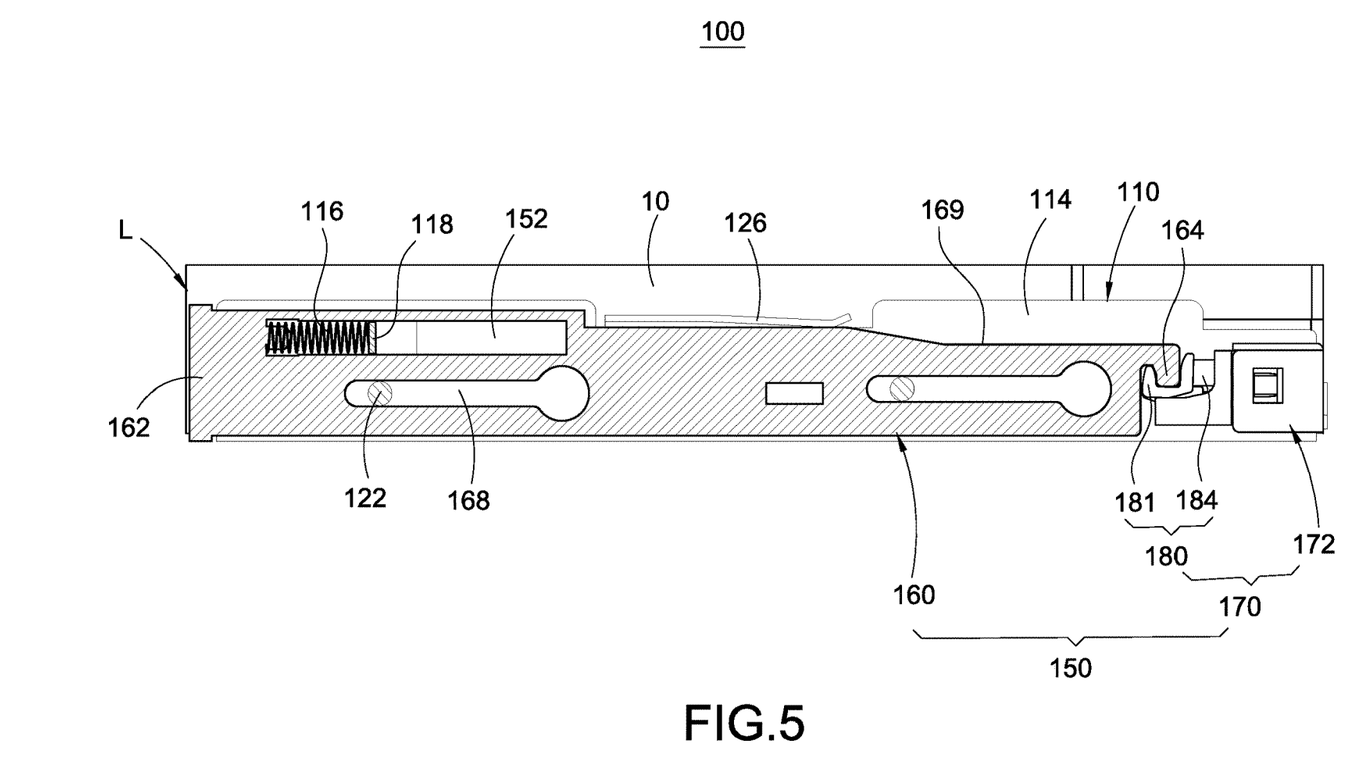
FIG. 5 is a cross-sectional view illustrating that a push rod of a detaching mechanism is in a fastened position.
Figure 10:
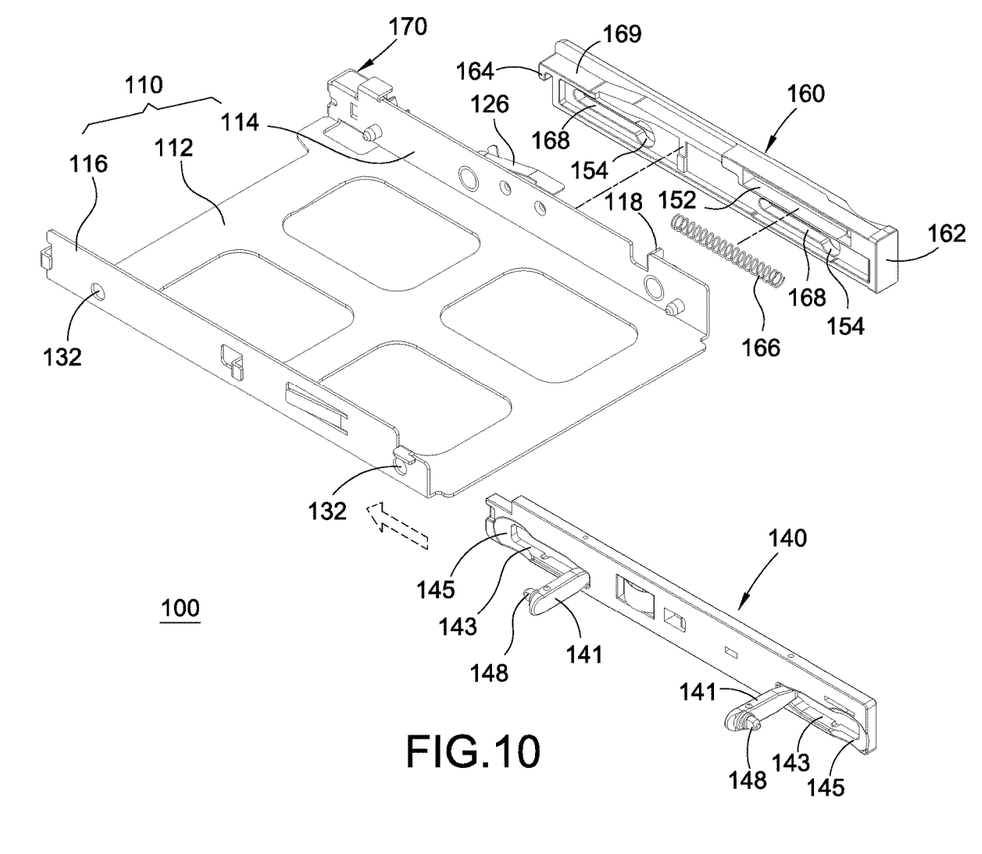
FIG. 10 is an exploded view illustrating the detaching mechanism and the release arm according to another embodiment of the present invention.
Figure 11:
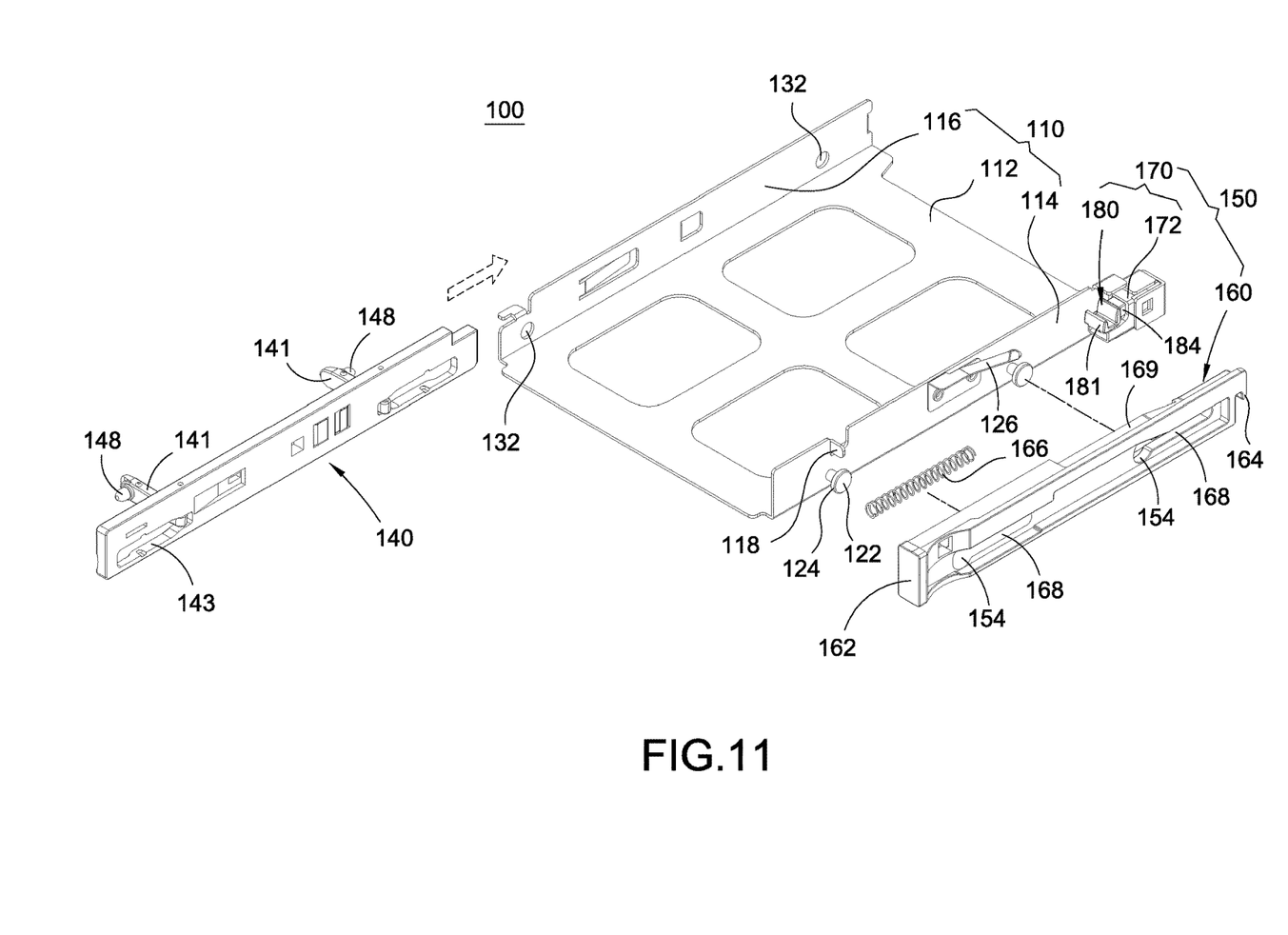
FIG. 11 is another exploded view of FIG. 10, viewed from a different angle.

However, in the embodiment shown in FIGS. 3, 10 and 11, the push rod 160 includes a second resilient element 166 received in an accommodating groove 152 of the push rod 160 and includes two guide trenches 168 spaced apart from each other. By means of the second resilient element 166, the push rod 160 automatically moves from the fastened position L to the detached position R. In order to enable the push rod 160 to slide stably and smoothly on the first side plate 114, the first side plate 114 further includes a blocking portion 118 for positioning the second resilient element 166, a first resilient plate 126 for limiting sliding movement of the push rod 160, and two guide pillars 122 for guiding sliding movement of the push rod 160. Each guide pillar 122 is disposed corresponding to each guide trench 168.

A flange 124 is disposed on a top of the guide pillar 122, and a size of the flange 124 is larger than a size of the guide trench 168. An open hole 154 is formed at one end of each guide trench 168 for insertion of the flange 124. This way, the push rod 160 is limited to slide along the guide trench 168.

When the latch structure 170 releases the push rod 160, the push rod 160 is pushed by a restoring force of the second resilient element 166 of the push rod 160, and the push rod 160 moves until it is blocked by the first resilient plate 126. At this point, the push rod 160 is in the detached position R, that is to say, the press portion 162 protrudes outward from the holding frame 110.

A release arm 140 can be fastened to the second side plate 116 by means of a fastening hook (not illustrated), thus effectively reduces a room required for operation. The release arm 140 includes two rotation bars 141 having two positioning pillars 148 respectively, includes two open slots 143 accommodating the two rotation bars 141, and also includes two operation holes 145 disposed at respective ends of the two rotation bars 141. A size of the operation hole 145 is larger than a size of the open slot 143. Through the operation hole 145, the user turns the rotation bar 141 with respect to the open slot 143, thereby releasing or positioning the storage device 10.

It should be noted that, the plurality of positioning pillars 134, 148 corresponding to respective positioning holes 20 of the storage device 10 can protrude from one or both of the first side plate 114 and the second side plate 116 in a direct manner or an indirect manner so as to fasten or release the storage device 10.

Figure 1:
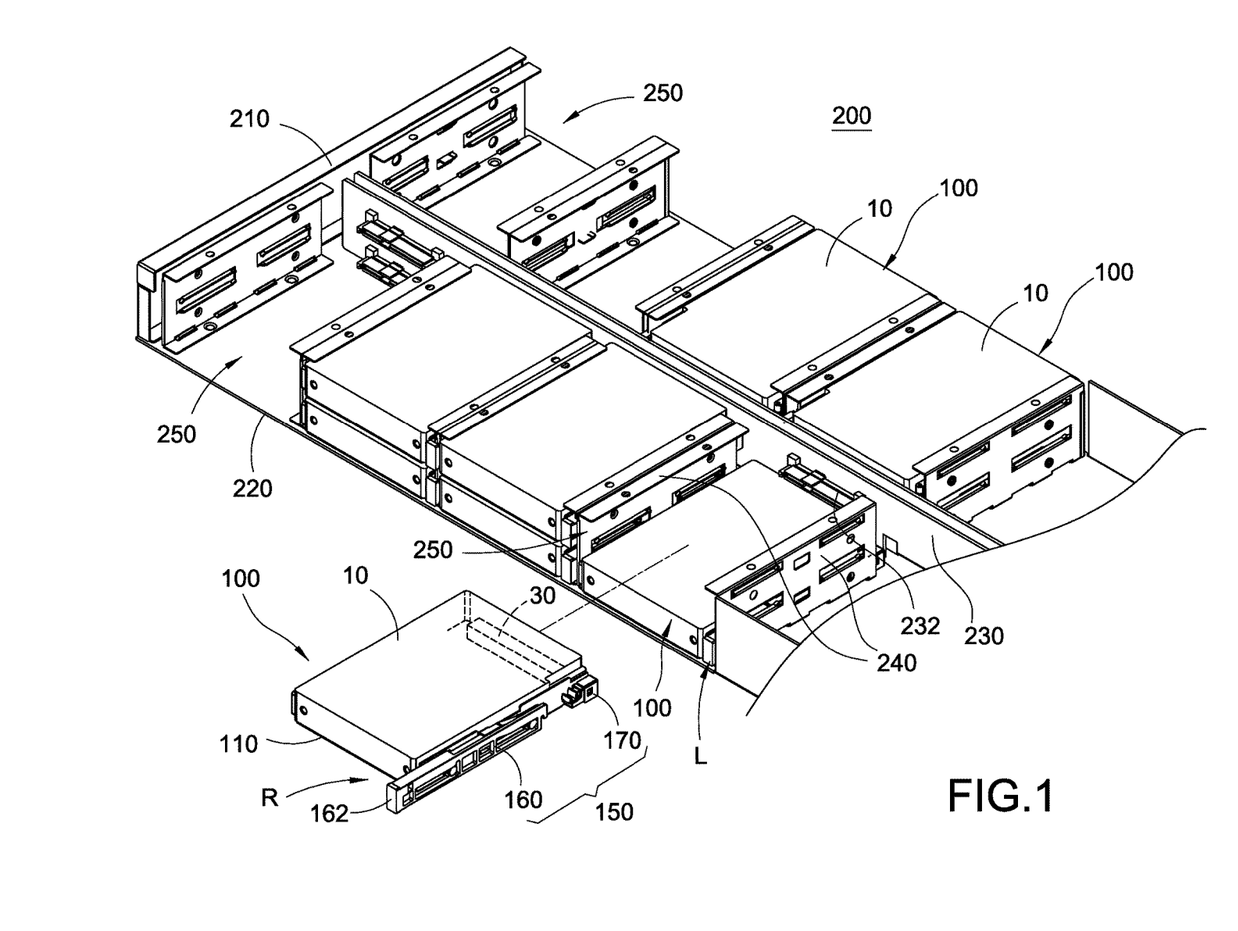
FIG. 1 is a schematic view illustrating a storage device holding mechanism and a server using the same according to one embodiment of the present invention.
Figure 2:
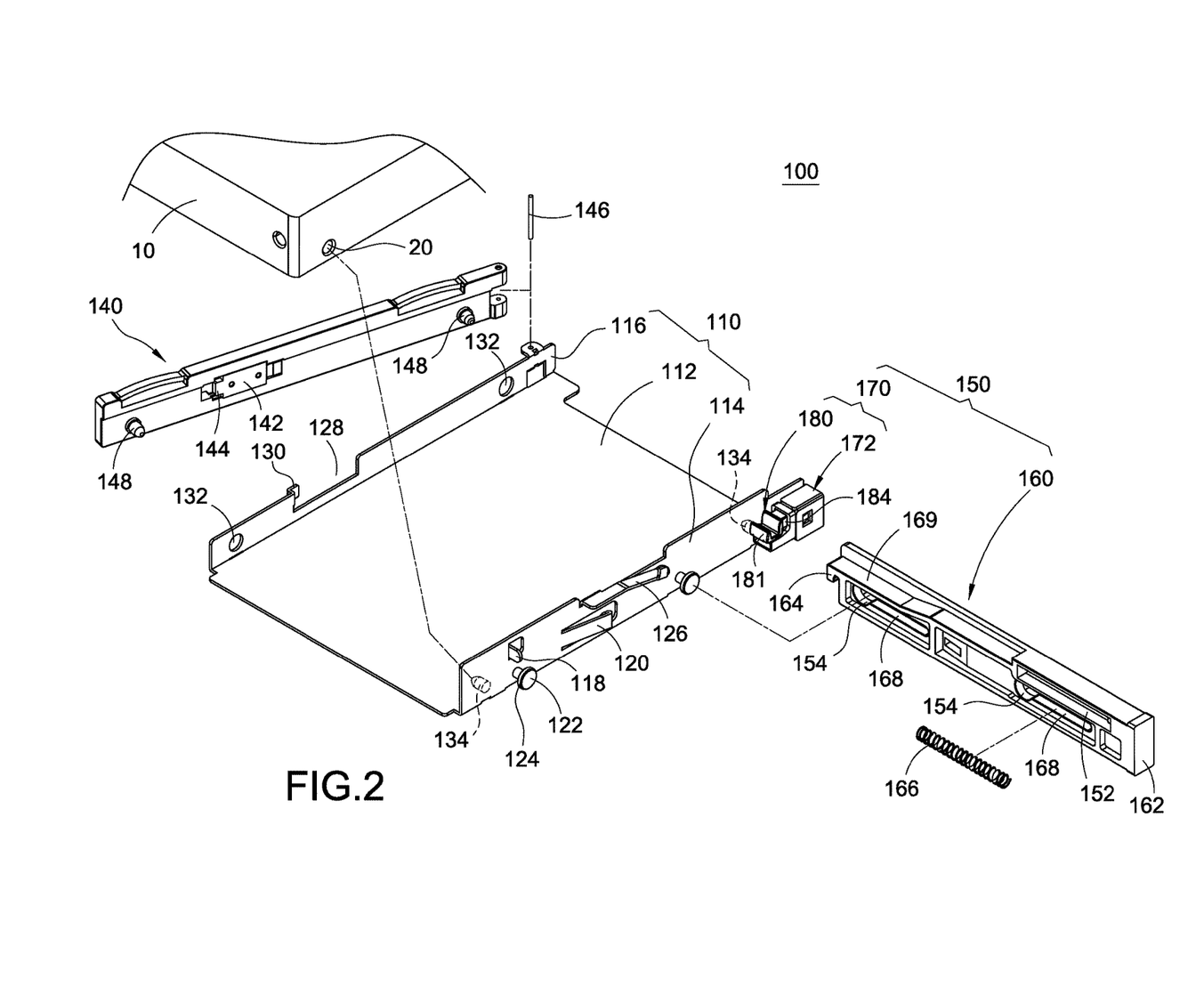
FIG. 2 is an exploded view illustrating the storage device holding mechanism.

The present invention further provides a server 200 comprising a chassis 210 and multiple storage device holding mechanisms 100, as shown in FIG. 1. The chassis 210 includes a tray 220, a back plate 230 perpendicularly disposed on the tray 220, a plurality of pairs of supporters 240 spaced apart from each other and arranged perpendicular to the back plate 230, and a plurality of accommodating spaces 250 formed between the respective pairs of supporters 240. Each storage device holding mechanism 100 is assembled in each accommodating space 250 corresponding to a corresponding pair of the supporters 240.

According to the embodiment shown in the drawing, there are preferably two back plates 230 and a plurality of plug connectors 232 electrically connected to each back plate 230. Each accommodating room 250 preferably receives two storage device holding mechanisms 100 stacked one above the other. The number of storage device holding mechanisms 100 in each chassis 210 may vary according to requirement.

Each storage device holding mechanism 100 is inserted into or removed from between each pair of the supporters 240 in a direction perpendicular to the direction in which the chassis 210 is pulled, and as a result, more storage devices 10 can be received. When the push rod 160 of each storage device holding mechanism 100 is in the detached position R, the user pulls out the push rod 160 further to detach the socket connector 30 of the storage device holding mechanism 100 from the corresponding plug connector 232 of the back plate 230.

When each storage device holding mechanism 100 is in the fastened position L, the push rods 160 are received in the respective accommodating spaces 250 between the respective pairs of supporters 240. In other words, the push rods 160 are flush with the respective pairs of supporters 240. In this way, the chassis 210 occupies a small room to facilitate miniaturization. Accordingly, the storage device holding mechanism 100 has a small size, the server 200 can be employed in a small room, and more storage devices 10 can be received.

What is claimed is:

1. A mechanism, comprising:
   a holding frame, the holding frame holding a storage device, the holding frame including a bottom plate and including a first side plate and a second side plate connected to the bottom plate at two opposite sides thereof; and
   a detaching mechanism assembled to one side of the first side plate, the detaching mechanism including a push rod and a latch structure for fastening the push rod, the push rod being fastened to the latch structure in a fastened position and configured to, when the latch structure releases the push rod, slide from the fastened position to a detached position where the push rod is detached from the latch structure, wherein when the push rod is in the fastened position, one end of the push rod is flush with one side of the holding frame.

2. The mechanism according to claim 1, wherein a press portion and a hook portion are disposed at two ends of the push rod respectively, the latch structure includes a base fixed to the first side plate and includes a movable element movable with respect to the base, wherein when the press portion is in the fastened position, the press portion is flush with one side of the holding frame, and the hook portion is fastened by a fastener of the movable element.

3. The mechanism according to claim 2, further comprising a first resilient element between the base and the movable element and includes a linkage which limits movement of the movable element, wherein when the hook portion pushes the movable element, the linkage releases the movable element, and the first resilient element pushes the movable element to remove the movable element out of the base, so that the fastener is rotated to release the hook portion.

4. The mechanism according to claim 3, wherein the movable element includes a root portion for guiding movement of the linkage, a swing head having the fastener, a connection section connected to the root portion and the swing head, the connection section is correspondingly disposed at one side of the first resilient element, a blocker and a track are disposed on at least one side of the root portion, and the blocker limits movement of the linkage or releases the linkage to move along the track.

5. The mechanism according to claim 4, wherein two ends of the first resilient element are in contact with the swing head and the base respectively, so as to push the swing head to rotate with respect to the base.

6. The mechanism according to claim 4, wherein the base includes a guide block, the base includes a limitation groove corresponding to the guide block, and the guide block is movable along the limitation groove.

7. The mechanism according to claim 1, further comprising a second resilient element received in the push rod, the second resilient element moving the push rod from the fastened position to the detached position.

8. The mechanism according to claim 7, wherein the first side plate includes a blocking portion for positioning the second resilient element, a first resilient plate for limiting sliding movement of the push rod, and a guide pillar for guiding sliding movement of the push rod, and the push rod includes a guide trench corresponding to the guide pillar.

9. The mechanism according to claim 8, wherein a flange is disposed on a top of the guide pillar, and a size of the flange is larger than a size of the guide trench, so that the push rod is limited to slide along the guide trench.

10. The mechanism according to claim 1, further including a release arm disposed at one side of the second side plate, the release arm including a positioning pillar protruding therefrom, a positioning hole corresponding to the positioning pillar being defined on the second side plate, the positioning pillar being inserted through or removed from the positioning hole to position or release the storage device.

11. The mechanism according to claim 10, wherein the release arm is fixed onto the second side plate, the release arm includes a rotation bar having the positioning pillar, includes an open slot accommodating the rotation bar, and also includes an operation hole disposed at one side of the open slot.

12. The mechanism according to claim 1, wherein a plurality of positioning pillars protrudes from one or both of the first side plate and the second side plate to position the storage device.

13. A server, comprising:
   a chassis, the chassis including a tray, a back plate perpendicularly disposed on the tray, a plurality of pairs of supporters spaced apart from each other and arranged perpendicular to the back plate, and a plurality of accommodating spaces formed between the respective pairs of supporters; and a plurality of mechanisms, each of the mechanisms comprising:
a holding frame holding a storage device, the holding frame including a bottom plate and including a first side plate and a second side plate connected to the bottom plate at two opposite sides thereof; and
a detaching mechanism assembled to one side of the first side plate, the detaching mechanism including a push rod and a latch structure for fastening the push rod, the push rod being fastened to the latch structure in a fastened position and configured to, when the latch structure releases the push rod, slide from the fastened position to a detached position where the push rod is detached from the latch structure, one end of the push rod is flush with one side of the holding frame; when the push rod is released from the latch structure, the push rod slides to the detached position; and each of the mechanisms is assembled in each of the accommodating spaces between a respective corresponding pair of the supporters.

14. The server according to claim 13, wherein the back plate includes a plurality of plug connectors provided for electrical connection and disposed corresponding to the accommodating spaces.

15. The server according to claim 13, wherein each of the mechanisms is inserted into or removed from each pair of the supporters in a direction perpendicular to a direction which the chassis is pulled.

16. The server according to claim 13, wherein when the push rod of the mechanism is in the detached position, the push rod is further pulled to detach the storage device holding mechanism from the back plate.

* * * * *